INSULATED GATE FIELD EFFECT TRANSISTOR
Filed Jan. 13, 1967
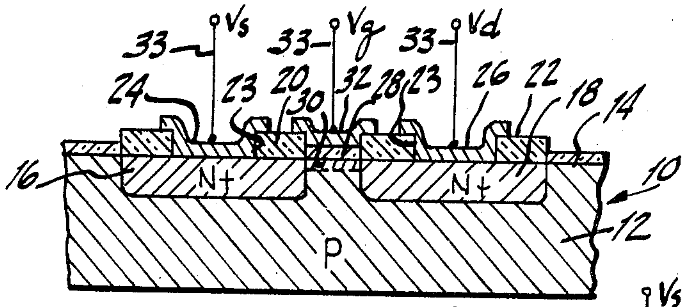
PRIOR ART FIG. 1.
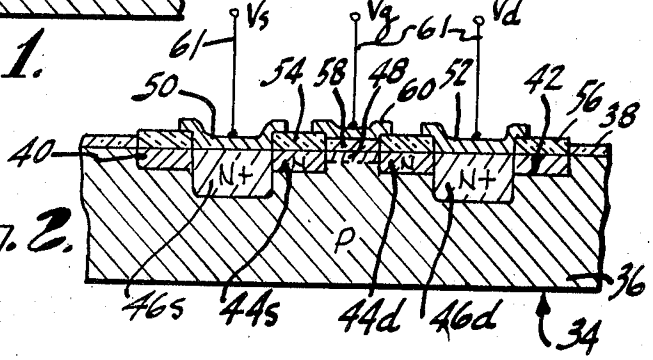
FIG. 2.
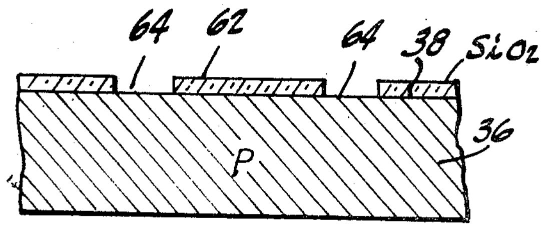
FIG. 3a.
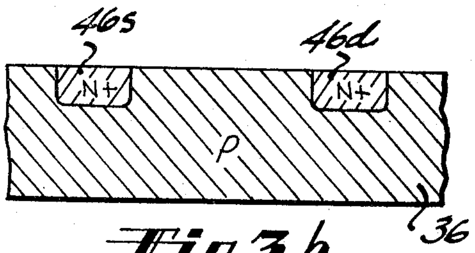
FIG. 3b.
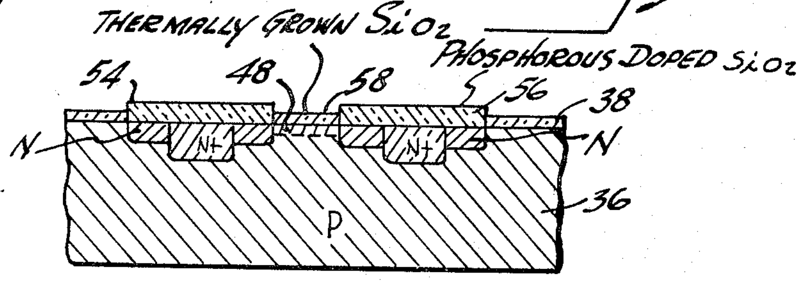
FIG. 3c.
INVENTOR
STEVEN R. HOFSTEIN United States Patent Office 3,434,021
Patented Mar. 18, 1969

3,434,021

INSULATED GATE FIELD EFFECT TRANSISTOR

Steven R. Hofstein, Princeton, N.J., assignor to Radio Corporation of America, a corporation of Delaware Filed Jan. 13, 1967, Ser. No. 609,079
U.S. Cl. 317—235 5 Claims
Int. Cl. H01l 11/14

ABSTRACT OF THE DISCLOSURE

A more stable insulated gate field-effect transistor has source and drain regions which, adjacent to the ends of the conductive channel, containing doping impurities in amounts less than $10^{19}$ cm.$^{-3}$.

*Background of the invention*

This invention relates to an insulated gate field-effect transistor and, more particularly, to such a transistor which has improved stability characteristics.

Insulated gate field-effect transistors constructed as taught by the prior art are subject to various types of instability. Apparently, the high electric fields associated with the operation of such devices produce changes in their internal structure. The instabilities manifest themselves in several ways. For example, one type of instability, which is thought to be due to motion of charges in the insulating oxide layer, results in a shift, in the negative direction, of the transistor transfer characteristic curve of drain current versus gate voltage.

Insulated gate field-effect transistors have been constructed carefully so that the oxide layers thereof are free of ions and molecules which could produce such instabilities. Tests show, however, that the instabilities are not entirely removed by this expedient. An instability remains which manifests itself as the generation of donor-type interface electronic states when a positive gate bias and heat are applied to the transistor. This instability affects both N and P type transistors as follows.

Insulated gate N type enhancement transistors, for example, are characterized by a transfer characteristic curve in which there is no drain current until a particular positive value of gate voltage, that is, the threshold voltage, is reached, after which drain current increases with increasing gate voltage. N type depletion transistors have a similarly shaped characteristic except that the condition of zero drain current is reached at negative gate voltages. In these N type devices, the effect of the application of heat and positive gate bias is to shift the transfer characteristic in such a way that, at low current levels, more negative values of gate voltage are required to produce the same values of current. This instability is not observed at higher values of drain current; that is, at higher current levels, the transfer characteristics are the same for both new N type transistors and those which have been biased and heated previously.

The transfer characteristics of P type transistors are also affected by positive gate bias and heat. In these devices, the instability appears as a lowering of the slope of the transfer characteristic for low drain currents and a parallel shift of the characteristic to lower values of gate voltage at higher current levels. In other words, more negative gate voltages are required to produce a given current in these devices after they have been positively biased at elevated temperatures.

It is believed that the cause of this instability is also the cause of the failure of the drain-to-substrate diode in both N and P type transistors.

It has been found that this instability is in some way related to the surface concentration of doping impurities in the source and drain regions of the transistors. Prior art transistors conventionally have source and drain regions in which the surface concentration of the dopant is greater than $10^{20}$ impurity atoms per cubic centimeter ($10^{20}$ cm.$^{-3}$) and this high concentration of impurities is such as to produce significant defects in the semiconductor crystal lattice. Such lattice defects apparently can move under the influence of heat and positive gate voltage so as to change the physical structure of the transistor.

*Summary of the invention*

The present transistor has source and drain regions in which at least that portion of each region which is immediately adjacent the respective ends of the channel contains doping impurities in amounts less than an amount capable of producing substantial physical defects in the semiconductor lattice. The maximum doping concentration in these portions is about $10^{19}$ cm.$^{-3}$. For practical commercial devices, a lower limit of $10^{17}$ cm.$^{-3}$ may be set for the doping concentration, this amount providing for reasonable values of series resistance adjacent to the ends of the channel. Portions of the source and drain regions more remote from the channel are heavily doped as in the prior art to secure sufficiently low sheet resistivity to provide good ohmic contact to the source and drain metal electrodes.

*The drawing*

In the drawing:

FIGURE 1 is a cross section through a typical insulated gate field-effect transistor constructed in accordance with the prior art;

FIGURE 2 is a cross section through a preferred embodiment of the present field-effect transistor; and FIGURES 3*a* to 3*c* illustrate a preferred processing sequence for fabricating the embodiment of FIGURE 2.

*The prior art structure*

A prior art transistor is designated generally by the numeral 10 in FIGURE 1. The transistor 10 comprises a substrate 12 which is typically of P type silicon having a resistivity of 1 to 25 ohm cm. The substrate 12 has a major surface 14 adjacent which the active components of the transistor are fabricated.

A pair of highly doped source and drain regions 16 and 18 are formed adjacent to the surface 14. In one process of fabricating transistors of this type, the source and drain regions 16 and 18 are produced by diffusing suitable impurities into the substrate 12 from spaced blocks 20 and 22 of doped silicon dioxide which are formed by conventional photoresist techniques. In the drawing, the blocks 20 and 22 are illustrated in their completed form as having been provided with holes 23 in which metallic source and drain electrodes 24 and 26 are formed.

In the conventional processing scheme mentioned above, a channel oxide layer 28 is formed simultaneously with the diffusion of the source and drain regions 16 and 18 by the thermal oxidation of the exposed portions of the surface 14. This oxidation also results in the formation of an inversion layer channel 30 extending between the source and drain regions 16 and 18. To complete the structure of the prior art transistor 10, a gate metal electrode 32 is deposited over the channel 30 and suitable leads 33 are bonded to the source, drain, and gate electrodes.

The source and drain regions 16 and 18 are conventionally doped heavily in order to insure good ohmic contact with the source and drain electrodes 24 and 26, and good ohmic contact to the respective ends of the channel 30. Typically, these regions contain doping impurities in amounts greater than $10^{20}$ cm.$^{-3}$.

*The present transistor*

The present improved field-effect transistor is designated generally by numeral 34 in FIGURE 2. The transistor 34 comprises a substrate 36 which may be of the same material as the substrate 12 in the transistor 10. Formed adjacent to the top surface 38 of the substrate 36 are spaced source and drain regions, generally designated by numerals 40 and 42, respectively. The source and drain regions 40 and 42 differ from the source and drain regions 16 and 18 of the transistor 10 in that they each contain a region or zone of medium doping, **44*s* and 44*d*, respectively, and a region of heavy doping, 46*s* and 46*d*. The medium doped regions 44*s* and 44*d* are positioned immediately adjacent to the ends of the conductive channel of this embodiment, designated by numeral 48, and the heavily doped regions 46*s* and 46*d* are positioned adjacent to the surface 38 so as to establish electrical communication between the medium doped regions 44*s* and 44*d* and a pair of source and drain metallic electrodes 50 and 52**.

Deposited blocks of insulating material 54 and 56 overlie the source and drain medium doped regions **44*s* and 44*d* and a thermally grown layer of insulation 58 overlies the channel 48. A gate electrode 60, positioned over the channel 48, and suitable leads 61, connected to the source, drain and gate electrodes, complete the structure of the transistor 34**.

The transistor 34 may be made by a processing sequence partially illustrated in FIGURES 3*a* to 3*c*. Well-known conventional steps, such as the application and removal of photoresist material, have been omitted from the illustration for purposes of clarity.

With reference to FIGURE 3*a*, the initial step in the process is to prepare the substrate 36 to receive the proper impurities to make the heavily doped regions **46*s* and 46*d* of the source and drain regions 40 and 42. For this purpose, a masking oxide layer 62 is applied to the top surface 38 of the substrate 36 and holes 64 are etched open at the locations desired for the heavily doped regions 46*s* and 46*d***.

The substrate 36, prepared as illustrated in FIGURE 3*a*, is next placed in a diffusion furnace and a suitable donor impurity such as phosphorous is diffused into the substrate 36 to form the heavily doped regions **46*s* and 46*d*. The masking oxide layer 62 is then stripped from the surface 38** in known manner, leaving the device as shown in FIGURE 3*b*.

After the diffusion of the heavily doped regions **46*s* and 46*d*, a phosphorous-doped oxide layer is applied to the surface 38 of the substrate 36 and etched away in such a manner as to leave blocks 54 and 56 over those portions of the substrate 36 which are intended to be the medium doped portions 44*s* and 44*d***. See FIGURE 3*c*. The device is then placed in a furnace and heated in an oxidizing atmosphere. This treatment causes phosphorous to diffuse from the oxide blocks 54 and 56 into the substrate 36 and simultaneously forms the thermal oxide coating 58. This treatment also may serve to produce the channel 48, as in the prior art processing.

The final step in the processing sequence for the transistor 34 is to etch open suitable holes in the oxide blocks 54 and 56 to permit contact to be made to the highly doped regions **46*s* and 46*d* by means of the electrodes 50 and 52 and, finally, to apply these electrodes and the gate electrode 60** in the proper locations on the exposed upper surface of the device, arriving finally at the configuration illustrated in FIGURE 2.

The concentrations of doping impurities in the respective regions **44*s* and 44*d* and 46*s* and 46*d* are such as to enable good contact to be made between the silicon and the source and drain electrodes 50 and 52, and also to establish ohmic connection to the respective ends of the channel 48. The doping concentration in the heavily doped regions 46*s* and 46*d* is substantially the same as in the prior art, namely, greater than $10^{20}$ cm.$^{-3}$. In the medium doped regions 44*s* and 44*d*, the doping concentration is made sufficiently low so that the impurities do not significantly disturb the physical perfection of the silicon lattice. The upper limit on the doping concentration for the regions 44*s* and 44*d* is set by that amount of impurities in which physical defects in the silicon become so severe that, under the influence of applied positive bias voltages and/or elevated temperature, these defects can migrate or propogate into the channel region. The maximum doping concentration for the medium doped regions 44*s* and 44*d*** has been determined to be approximately $10^{19}$ cm.$^{-3}$ for a stable transistor. The concentration may be as low as $10^{17}$ cm.$^{-3}$ before the operating characteristics of the device become impractical.

The present improved transistor can be used in the same circuits as prior art transistors. In addition, however, unlike prior art transistors, the present transistor can be used under conditions of positive gate bias. For example, an N type depletion transistor constructed as disclosed herein may be operated in both the depletion and enhancement modes without significant changes in its transfer characteristic.

I claim:

1. An improved field-effect transistor comprising a crystalline semiconductor body having a conductive channel adjacent a surface thereof, spaced source and drain regions in said body adjacent said surface in ohmic contact with said channel, a layer of insulating material on said surface overlying said channel and a gate electrode on said layer opposite said channel, wherein the improvement comprises:

at least those portions of each of said source and drain regions immediately adjacent the respective ends of said channel containing an amount of doping impurity means insufficient to produce substantial disturbances in the crystal lattice therein.

2. An improved field-effect transistor as defined in claim 1 wherein the concentration of dopant impurities in said portions is less than $10^{19}$ cm.$^{-3}$.

3. An improved field-effect transistor as defined in claim 2 wherein the concentration of doping impurities in said portions is greater than $10^{17}$ cm.$^{-3}$.

4. An improved field-effect transistor including a body of crystalline semiconductive material having a conductive channel adjacent to one surface thereof, spaced heavily-doped regions in said body in ohmic electrical communication with said channel, a layer of insulating material on said surface overlying said channel, and a gate electrode on said layer opposite said channel, wherein the improvement comprises:

a zone of the same conductivity type as said heavily-doped regions but of lower doping concentration interposed between and ohmically interconnecting each of said heavily-doped regions and said channel.

5. An improved field-effect transistor as defined in claim 4 wherein said body is silicon and said heavily-doped regions are doped to degeneracy, said regions of low doping concentration containing doping impurities in an amount between $10^{17}$ cm.$^{-3}$ and $10^{19}$ cm.$^{-3}$.

References Cited

UNITED STATES PATENTS

| | | | |
|---|---|---|---|
| 3,246,173 | 4/1966 | Silver | 317—235 X |
| 3,328,210 | 6/1967 | McCaldin et al. | 148—1.5 |
| 3,328,604 | 6/1967 | Burns et al. | 317—235 X |
| 3,378,738 | 4/1968 | McIver | 317—235 |

JAMES D. KALLAM, *Primary Examiner.*

U.S. Cl. X.R.

317—234